US007112993B2

(12) United States Patent
Speers

(10) Patent No.: US 7,112,993 B2
(45) Date of Patent: Sep. 26, 2006

(54) NON-VOLATILE MEMORY CONFIGURATION SCHEME FOR VOLATILE-MEMORY-BASED PROGRAMMABLE CIRCUITS IN AN FPGA

(75) Inventor: Theodore Speers, San Jose, CA (US)

(73) Assignee: Actel Corporation, Mountain View, CA (US)

( * ) Notice: Subject to any disclaimer, the term of this patent is extended or adjusted under 35 U.S.C. 154(b) by 85 days.

(21) Appl. No.: 11/021,472

(22) Filed: Dec. 23, 2004

(65) Prior Publication Data
US 2006/0139053 A1    Jun. 29, 2006

(51) Int. Cl.
*H03K 19/173* (2006.01)
(52) U.S. Cl. .......................................... 326/38; 326/41
(58) Field of Classification Search ............. 326/37–41
See application file for complete search history.

(56) References Cited

U.S. PATENT DOCUMENTS 5,107,146 A * 4/1992 El-Ayat ...................... 326/41
5,497,475 A * 3/1996 Alapat ......................... 711/103
5,909,463 A * 6/1999 Johnson et al. .............. 375/220
6,389,078 B1 * 5/2002 Hessel et al. ................ 375/259
7,030,651 B1 * 4/2006 Madurawe .................... 326/41
7,034,569 B1 * 4/2006 Balasubramanian et al. .. 326/38

* cited by examiner

*Primary Examiner*—Don Le
(74) *Attorney, Agent, or Firm*—Sierra Patent Group, Ltd.

(57) ABSTRACT

A non-volatile memory configuration scheme is disclosed for volatile-memory-based programmable circuits in a programmable integrated circuit that includes an FPGA fabric, a plurality of first configurable circuit elements external to the FPGA fabric, and a plurality of second configurable circuit elements external to the FPGA fabric. A plurality of distributed configuration non-volatile memory cells is disposed in the FPGA, each one of the distributed configuration non-volatile memory cells coupled to a different one of the plurality of first configurable circuit elements. A non-volatile memory array stores configuration information for the second configurable circuit elements. A plurality of register cells is disposed with the second configurable circuit elements and is coupleable to the non-volatile memory array, each one of the register cells coupled to a different one of the plurality of second configurable circuit elements.

8 Claims, 2 Drawing Sheets

NON-VOLATILE MEMORY CONFIGURATION SCHEME FOR VOLATILE-MEMORY-BASED PROGRAMMABLE CIRCUITS IN AN FPGA

BACKGROUND

The present invention relates to integrated circuit technology. More particularly, the present invention relates to programmable logic circuits, such as FPGAs, and particularly flash-based programmable logic circuits. The present invention addresses how to efficiently provide static control signals to circuit elements external to the FPGA fabric without compromising the bandwidth of the dynamic signal path.

An FPGA integrated circuit includes many circuit elements in addition to the FPGA fabric that require bits to control their functionality. A typical example is a general purpose I/O cell which typically has three dynamic signals (i.e., input, output, enable) that must be capable of being driven by a net from and to the FPGA.

Accompanying these signals are usually several control signals (which may number ten or more) that typically do not need connectivity to a net but need to be statically set. Such signals include those to configure the I/O standard being implemented (e.g. HSTL, PCI, etc.), and the enabling of delay elements in the input path. As the element gets more complex, the number of required static control signals can become much larger than the number of dynamic signals. An example of this is a SerDes with physical coding sub-layer (PCS) circuitry which may require static control signals for idle, align and stuff characters (16 bits each), SerDes drive, pre-emphasis and equalization control, and PCS data path selection.

As the number of signals necessary to configure circuit elements outside of the FPGA fabric increases, so does the number of signal lines needed to carry those signals. At some point, the bandwidth of the dynamic signal path is affected, since there is a physical limit to the number of conductors that can pass outside of the FPGA fabric. The present invention addresses how to efficiently provide those control signals to the circuit elements without compromising the bandwidth of the dynamic signal path.

Referring first to FIG. 1, a block diagram illustrates a prior-art arrangement for configuring circuit elements external to an FPGA array in an integrated circuit. Integrated circuit 10 includes an FPGA array 12 and also includes a group of external circuit elements 14. As is known in the art, the group of external circuit elements 14 may include circuit elements that need to be configured by static signals to control aspects of their operation. Representative ones of such configurable circuit elements are represented by small squares 16, 18, 20, 22, 24, 26, 28, and 30. Persons of ordinary skill in the art will appreciate that such configurable circuit elements can be as simple as an I/O or as complex as a PCS or a processor.

The configurable circuit elements 16, 18, 20, 22, 24, 26, 28, and 30 are controlled, respectively, by configuration bits 32, 34, 36, 38, 40, 42, 44, and 46, distributed throughout the FPGA array 12. Thus configuration bit 32 is shown coupled to external configurable circuit element 16, configuration bit 34 is shown coupled to external configurable circuit element 18, and so forth. The configuration bits may comprise non-volatile memory cells such as flash memory cells.

As will be apparent to persons of ordinary skill in the art examining FIG. 1, an individual conductor is needed to make each of the connections, thus requiring eight conductors running from the FPGA 12 to the external circuit elements 14 for making the eight connections in the illustrative example of FIG. 1.

In real-world integrated circuits that implement the above-described scheme, the number of connections between configuration bits in the FPGA array and the external circuit elements becomes exceedingly large as the size of the integrated circuit (i.e., gate count and number of I/O and other circuits external to the FPGA) increases. In addition, as the control requirements proliferate, there may not be enough physical room or architectural bandwidth to efficiently route one signal per control bit to the external element without compromising the effective bandwidth of the dynamic signals. At some point, the number of such conductors becomes unreasonably large and can become a critical design issue. The present invention presents a solution to this problem.

The configurable circuit elements 16, 18, 20, 22, 24, 26, 28, and 30 are controlled, respectively, by configuration bits 32, 34, 36, 38, 40, 42, 44, and 46, distributed throughout the FPGA fabric 12. Thus configuration bit 32 is shown coupled to external configurable circuit element 16, configuration bit 34 is shown coupled to external configurable circuit element 18, and so forth. The configuration bits may comprise non-volatile memory cells such as flash memory cells.

As will be apparent to persons of ordinary skill in the art examining FIG. 1, an individual conductor is needed to make each of the connections, thus requiring eight conductors running from the FPGA 12 to the external circuit elements 14 for making the eight connections in the illustrative example of FIG. 1.

In real-world integrated circuits that implement the above-described scheme, the number of connections between configuration bits in the FPGA fabric and the external circuit elements becomes exceedingly large as the size of the integrated circuit (i.e., gate count and number of I/O and other circuits external to the FPGA) increases. In addition, as the control requirements proliferate, there may not be enough physical room or architectural bandwidth to efficiently route one signal per control bit to the external element without compromising the effective bandwidth of the dynamic signals. At some point, the number of such conductors becomes unreasonably large and can become a critical design issue. The present invention presents a solution to this problem.

BRIEF DESCRIPTION OF THE INVENTION

A non-volatile memory configuration scheme for volatile configurable circuits in a programmable integrated circuit including an FPGA fabric and is provided. The integrated circuit also includes configurable circuit elements disposed on the integrated circuit external to the FPGA fabric. Two sets of configurable circuit elements are disposed on integrated circuit external to the FPGA fabric. Distributed configuration non-volatile memory cells are disposed in the FPGA fabric. Each member of the first set of configurable circuit elements is coupled to a different one of the distributed configuration non-volatile memory cells. A non-volatile memory array is provided for storing configuration information for the members of the second set of configurable circuit elements. Each member of the second set of configurable circuit elements is configured by a different non-volatile memory array bit.

BRIEF DESCRIPTION OF THE DRAWING FIGURES

DETAILED DESCRIPTION

Those of ordinary skill in the art will realize that the following description of the present invention is illustrative only and not in any way limiting. Other embodiments of the invention will readily suggest themselves to such skilled persons.

Figure 1:
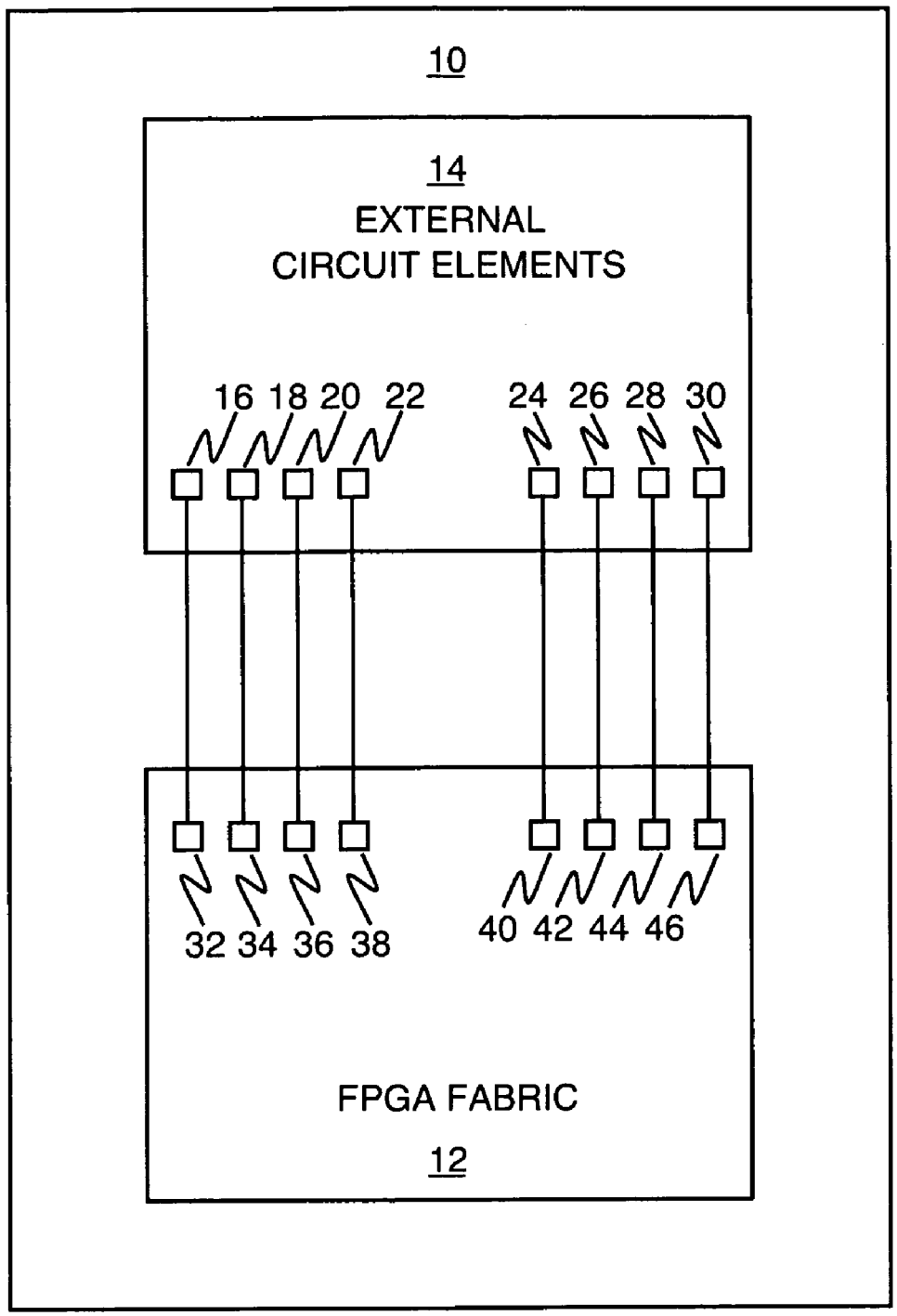
FIG. 1 is a block diagram of a prior-art arrangement for configuring circuit elements external to an FPGA fabric in an integrated circuit.
Figure 2:
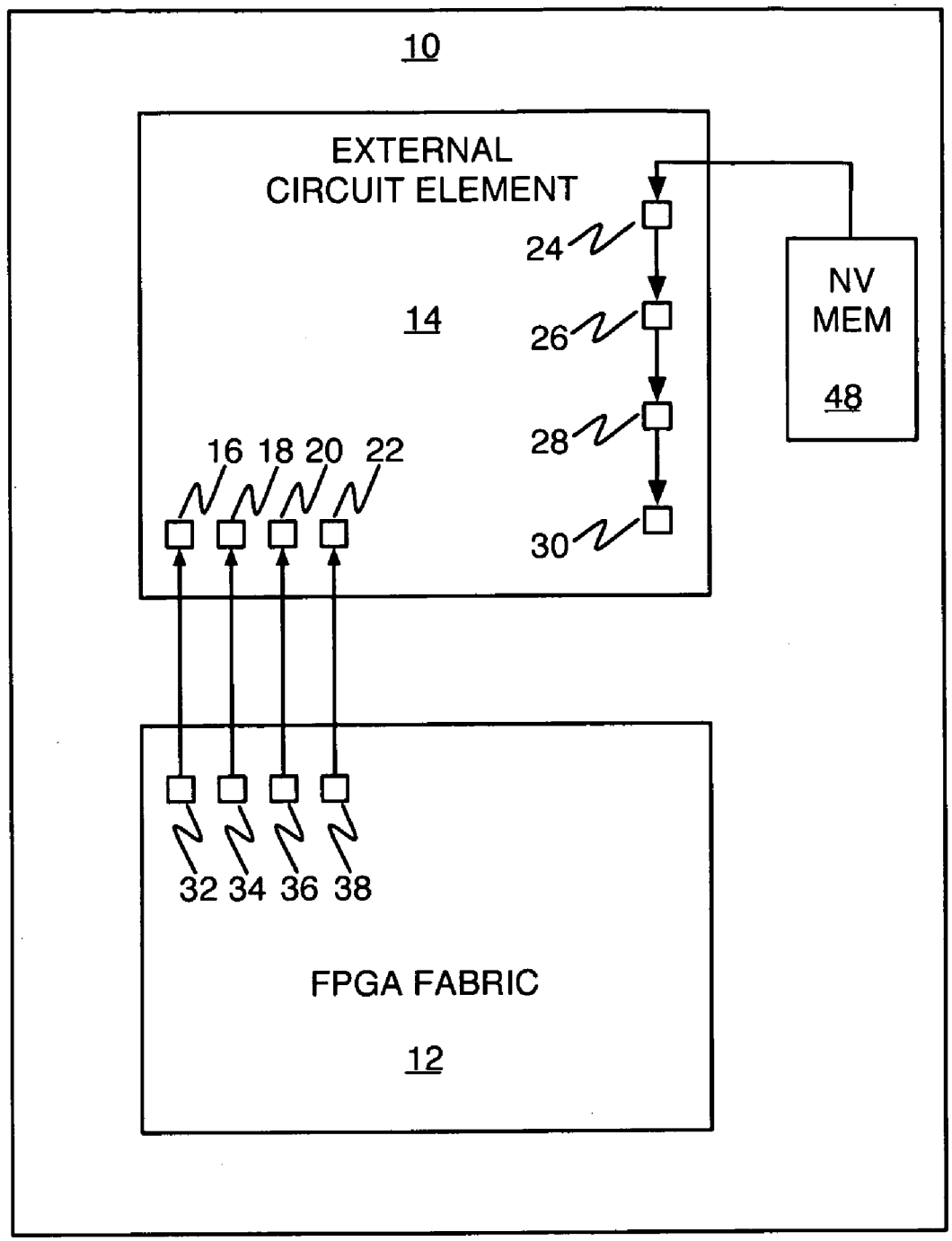
FIG. 2 is a block diagram of an illustrative arrangement for configuring circuit elements external to an FPGA fabric in an integrated circuit according to the principles of the present invention.

Referring now to FIG. 2, a block diagram presents an illustrative arrangement for configuring circuit elements external to an FPGA fabric in an integrated circuit according to the principles of the present invention. As in the circuit arrangement of FIG. 1, the arrangement of FIG. 2 shows an integrated circuit 10 including an FPGA fabric 12 and a group of external configurable circuit elements 14. As in FIG. 1, representative ones of such configurable circuit elements are represented by small squares 16, 18, 20, 22, 24, 26, 28, and 30.

The configurable circuit elements 16, 18, 20, and 22 are shown in FIG. 2 as being controlled, respectively, by configuration bits 32, 34, 36, and 38, distributed throughout the FPGA fabric 12. Thus configuration bit 32 is shown coupled to external configurable circuit element 16, configuration bit 34 is shown coupled to external configurable circuit element 18, configuration bit 36 is shown coupled to external configurable circuit element 20, and configuration bit 38 is shown coupled to external configurable circuit element 22. The configuration bits may comprise non-volatile memory cells such as flash memory cells.

However, unlike the prior-art circuit arrangement of FIG. 1, other configurable circuit elements 24, 26, 28, and 30 are shown being controlled by an on-chip non-volatile memory array 48 separate from the FPGA fabric 12 in which the memory cells may be located together instead of distributed like configuration bits 32, 34, 36, and 38 are in FPGA fabric 12. Upon power-up of the integrated circuit, the data needed to control configurable circuit elements 24, 26, 28, and 30 can be read out of non-volatile memory 48 into register cells associated with configurable circuit elements 24, 26, 28, and 30 in the same manner known in the art for configuring volatile-storage-based (e.g., SRAM-based) FPGA integrated circuits. FIG. 2 shows a serial readout of data into configurable circuit elements 24, 26, 28, and 30.

Circuit elements on an FPGA device that are external to the FPGA fabric may include both configurable circuits that must be configured immediately upon power-up of the device, and configurable circuits that do not have to be configured immediately. For example, if the external circuit elements include circuits that are capable of being hot-swapped, or any circuits that control the state of an input/output (I/O) circuit at power-up. As an example, drive strength configuration circuitry for a SerDes is required to be configured immediately upon power-up to control a drive strength configuration signal. It is undesirable to have the SerDes power up and drive the signal too high and risk damaging elements of a system in which the FPGA device is incorporated. The present invention avoids the need for existing work-arounds presently used to avoid the necessity of applying these signals instantly. It is desirable that certain signals be controlled and applied instantly, for board protection and other reasons, while other signals do not have to be controlled or applied instantly. Generally, circuits that do not control I/Os do not have to be configured immediately upon power-up.

During power-up of a non-volatile FPGA device with an on-board non-volatile memory block, the FPGA fabric is powered up before the non-volatile memory block, so circuits configured by the FPGA fabric will be configured before circuits configured by the non-volatile memory block. However, configuration bits in the FPGA fabric are individually and directly connected to the configurable circuit elements they control. Configuration bits in the non-volatile memory, on the other hand, may control the configurable circuit elements through addressing (e.g., via a shift register). This limits the speed of the configuration, but also reduces the number of physical connections that are required to be routed into the external circuit element block. Since the number of direct connections into the external circuit block is subject to physical limitations, configuring some of the configurable circuits from the non-volatile memory block increases design flexibility. Even in an alternative embodiment, where the non-volatile memory bits are directly connected to the configurable circuits they control, the number of direct connections from the FPGA fabric to the external circuit block is reduced, thereby freeing up external connection lines from the FPGA fabric (or the space such lines would occupy) for other uses.

The circuitry of the present invention allows an FPGA device including an on-chip non-volatile memory to configure some of the configurable circuit elements that are external to the FPGA fabric using the non-volatile memory while configuring other circuit elements from the FPGA fabric.

The approach of the present invention permits a designer to control configuration signals that are preferably or necessarily valid as close to system power-on as possible using the distributed non-volatile storage configuration bits in the FPGA while allowing the slower loading of less-critical configuration bits from a non-volatile memory array into configuration registers associated with the configurable external circuits.

As can be seen from the above explanation, the present invention employs a hybrid approach whereby static signals that need to be applied instantly at power-on can be powered on immediately.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A non-volatile memory configuration scheme for volatile configurable circuits in a programmable integrated circuit comprising:
   an FPGA fabric;
   a first plurality of configurable circuit elements disposed on the integrated circuit external to the FPGA fabric;
   a second plurality of configurable circuit elements disposed on the integrated circuit external to the FPGA fabric;
   a plurality of distributed configuration non-volatile memory cells disposed in the FPGA fabric, each of the plurality of first configurable circuit elements coupled to a different one of the distributed configuration non-volatile memory cells;

a non-volatile memory array for storing configuration information for the second configurable circuit elements; and a plurality of register cells disposed within the second plurality of configurable circuit elements and coupleable to the non-volatile memory array, each one of the register cells associated with a different one of the plurality of second configurable circuit elements.

2. The non-volatile memory configuration scheme of claim 1, wherein said first plurality of configurable circuit elements comprise circuit elements that are selected to be configured prior to configuring the second plurality of configurable circuit elements.

3. The non-volatile memory configuration scheme of claim 1, wherein the plurality of distributed configuration non-volatile memory cells is coupled to the first plurality of configurable circuit elements by individual conductors running between the FPGA fabric and the first plurality of configurable circuit elements.

4. The non-volatile memory configuration scheme of claim 1, wherein said first plurality of configurable circuit elements comprises I/O circuit elements.

5. The non-volatile memory configuration scheme of claim 1 wherein said first plurality of configurable circuit elements comprises SerDes circuits.

6. The non-volatile memory configuration scheme of claim 1, wherein said first plurality of configurable circuit elements comprises processor circuits.

7. The non-volatile memory configuration scheme of claim 1, wherein said first plurality of configurable circuit elements comprises math block circuits.

8. The non-volatile memory configuration scheme of claim 1, wherein said first plurality of configurable circuit elements comprises random access memory circuits.

* * * * *